(12) United States Patent
Doi et al.

(10) Patent No.: US 7,782,585 B2
(45) Date of Patent: Aug. 24, 2010

(54) SEMICONDUCTOR INTEGRATED CIRCUIT DEVICE

(75) Inventors: Mikiya Doi, Kyoto (JP); Hiroki Takeuchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 418 days.

(21) Appl. No.: 11/816,655

(22) PCT Filed: Mar. 1, 2006

(86) PCT No.: PCT/JP2006/303903

§ 371 (c)(1),
(2), (4) Date: Aug. 20, 2007

(87) PCT Pub. No.: WO2006/093204

PCT Pub. Date: Sep. 8, 2006

(65) Prior Publication Data

US 2009/0027820 A1    Jan. 29, 2009

(30) Foreign Application Priority Data

Mar. 2, 2005    (JP)    ............................. 2005-056792

(51) Int. Cl.
*H02H 5/00* (2006.01)
(52) U.S. Cl. ...................................... 361/103
(58) Field of Classification Search .................. 361/103
See application file for complete search history.

(56) References Cited

U.S. PATENT DOCUMENTS 5,226,319 A * 7/1993 Suzuki ..................... 73/204.14

FOREIGN PATENT DOCUMENTS

| JP | 05-328587 | 12/1993 |
|----|-----------|---------|
| JP | 6-16540 | 3/1994 |
| JP | 07-050389 | 2/1995 |
| JP | 10-326868 | 12/1998 |
| JP | 11-015545 | 1/1999 |
| JP | 2004-253936 | 9/2004 |
| JP | 2005-026307 | 1/2005 |

* cited by examiner

*Primary Examiner*—Stephen W Jackson
(74) *Attorney, Agent, or Firm*—Fish & Richardson P.C.

(57) ABSTRACT

An overheat protection circuit 1 of a semiconductor integrated circuit device of the invention has filter means for removing a high frequency component from a power supply voltage Vcc. Specifically, the overheat protection circuit 1 has: a band gap power supply portion BG and resistors R1 and R2 that produce a reference voltage Vref; a transistor N1 for temperature detection; resistors R3 and R4 that generate, from the power supply voltage Vcc, a control signal Sctrl according to the on/off state of the transistor N1; a transistor P1 that is turned on/off according to the control signal Sctrl; and a transistor N2 and resistors R5 and R6 that generate an overheat protection signal Stsd according to the on/off state of the transistor P1. In addition, the overheat protection circuit 1 has, as the filter means, a resistor R7 and a capacitor C1 that are respectively connected to the emitter and the collector of the transistor P1. This makes it possible to perform a high-accuracy overheat protection operation despite variations in power supply voltage (superimposition of pulse).

7 Claims, 2 Drawing Sheets

SEMICONDUCTOR INTEGRATED CIRCUIT DEVICE

TECHNICAL FIELD

The present invention relates to semiconductor integrated circuit devices having an overheat protection circuit. More particularly, the present invention relates to an improvement in the accuracy of the overheat protection capability thereof.

BACKGROUND ART

Conventionally, many semiconductor integrated circuit devices (hereinafter "ICs (integrated circuits)") that drive power transistors, such as power supply devices and motor driving devices, incorporate an overheat protection circuit (a so-called thermal shutdown circuit) for preventing the breakdown of the ICs (in particular, the power transistors thereof) due to an abnormal rise in temperature of the ICs (see Patent Documents 1 and 2, which the applicant of the present invention once filed). The aforementioned overheat protection circuit is so configured as to generate an overheat protection signal by exploiting the property that Vf (the base-emitter forward voltage drop) of a bipolar transistor varies in general depending on the ambient temperature.

Patent Document 1: JP-A-2004-253936

Patent Document 2: JP-B-H06-16540

DISCLOSURE OF THE INVENTION

Problems to be Solved by the Invention

It is true that the ICs disclosed in Patent Documents 1 and 2 make it possible to prevent the breakdown of the ICs by detecting an abnormal rise in temperature of the ICs due to a malfunction or overload and de-energizing the load.

However, since the conventional ICs described above are not required to perform an extremely-fast overheat protection operation, no particular measures are taken to prevent a malfunction of the overheat protection circuit due to variations in power supply voltage (superimposition of noise).

As a result, the following problem arises. When an object to be monitored for overheating is also a noise source, noise is undesirably superimposed on the power supply voltage of the overheat protection circuit provided near the object to be monitored for overheating, resulting in the generation of a wrong overheat protection signal.

In particular, more and more switching power supply devices and motor driving devices have recently come to incorporate a power transistor, which is a noise source, into an IC. Such an IC is vulnerable to the problem described above because pulse noise caused by the on/off of the power transistor is easily superimposed on the power supply voltage of the overheat protection circuit. This makes it difficult to place the overheat protection circuit near the power transistor, which is also an object to be monitored for overheating.

In view of the conventionally experienced problems described above, it is an object of the present invention to provide semiconductor integrated circuit devices that can perform a high-accuracy overheat protection operation despite variations in power supply voltage (superimposition of pulse).

Means for Solving the Problem

To achieve the above object, according to one aspect of the present invention, a semiconductor integrated circuit device is provided with: a power transistor for which switching control is performed; and an overheat protection circuit for detecting an abnormal rise in temperature of the power transistor and notifying a circuit to be protected of the abnormal rise in temperature. Here, the overheat protection circuit includes a filter portion for removing, from a power supply voltage thereof, a frequency component that is higher than a predetermined cut-off frequency (a first configuration).

More specifically, in the semiconductor integrated circuit device having the first configuration described above, the overheat protection circuit is provided with: a reference voltage producing portion for producing a predetermined reference voltage; a bipolar transistor for temperature detection that is provided next to the power transistor and turned on/off according to whether a base-emitter forward voltage drop which varies depending on an ambient temperature is higher or lower than the reference voltage; a control voltage signal generating portion for generating from the power supply voltage a control voltage signal having a logic according to an on/off state of the bipolar transistor; a switch portion that is turned on/off according to the logic of the control voltage signal; and an overheat protection signal generating portion for generating an overheat protection signal having a logic according to an on/off state of the switch portion. As the filter portion, the overheat protection circuit is further provided with: a resistor that is inserted between one end of the switch portion and a point to which the power supply voltage is applied; and/or a capacitor that is inserted between the other end of the switch portion and a ground (a second configuration).

Preferably, in the semiconductor integrated circuit device having the second configuration described above, the reference voltage producing portion is provided with: a band gap power supply portion for producing a band gap voltage which is independent of the ambient temperature; and a resistance dividing portion for producing the reference voltage from the band gap voltage (a third configuration).

Preferably, in the semiconductor integrated circuit device having the third configuration described above, the reference voltage producing portion is provided with, between the band gap power supply portion and the resistance dividing portion, a current buffer portion for improving current capability (a fourth configuration).

In the semiconductor integrated circuit device having one of the first to fourth configurations, the power transistor forms a switching power supply circuit or a motor driving circuit.

EFFECT OF THE INVENTION

With the semiconductor integrated circuit device according to present invention, even when an overheat protection circuit is placed near an object to be monitored for overheating, which is a noise source, it is possible to perform a high-accuracy overheat protection operation despite variations in power supply voltage (superimposition of pulse).

| List of Reference Symbols | |
|---|---|
| 1 | Overheat protection circuit |
| 2 | Switching power supply circuit |
| 10 | Switching power supply IC |
| T1 | Power supply terminal |
| BG | Band gap power supply portion |
| R1 to R7 | Resistor |
| C1 | Capacitor |
| N1 to N3 | NPN bipolar transistor |
| P1 and P2 | PNP bipolar transistor |
| PFET1 | P-channel field-effect transistor |
| I1 | Constant current source |
| IBUF | Current buffer portion |

BEST MODE FOR CARRYING OUT THE INVENTION

Hereinafter, a semiconductor integrated circuit device of the present invention will be specifically described, taking up as an example a switching power supply IC.

Figure 1:
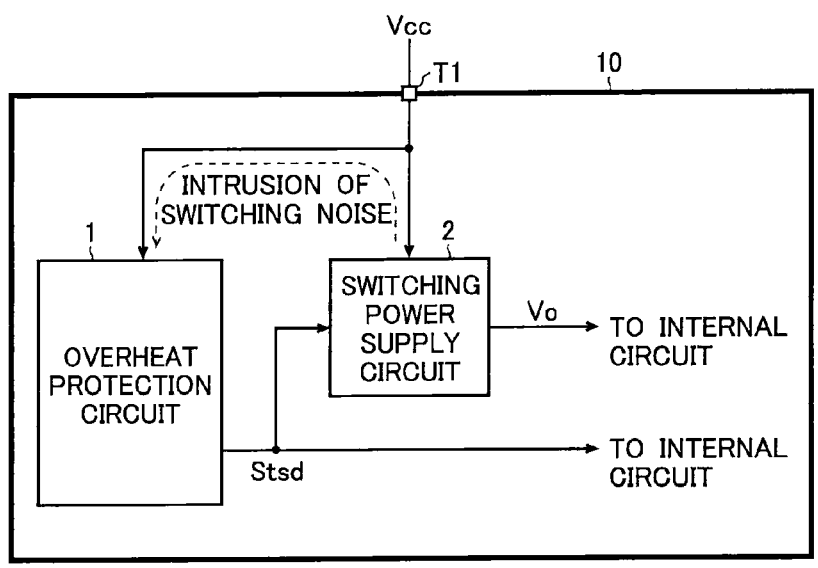
[FIG. 1] A block diagram showing an outline of a switching power supply IC according to the invention.

FIG. 1 is a block diagram showing an outline of the configuration of a switching power supply IC of the invention. As shown in this drawing, a switching power supply IC 10 includes an overheat protection circuit 1 and a switching power supply circuit 2.

The overheat protection circuit 1, which operates on a power supply voltage Vcc supplied via an external terminal T1, is so configured as to generate an overheat protection signal Stsd by exploiting the property that Vf (the base-emitter forward voltage drop) of the bipolar transistor varies depending on the ambient temperature. The overheat protection signal Stsd is a signal for notifying a circuit to be protected (an unillustrated internal circuit and the switching power supply circuit 2) of an abnormal chip temperature, and is used for shutdown control when the temperature of the IC rises abnormally. Incidentally, the overheat protection circuit 1 is provided near the switching power supply circuit 2 (in particular, the power transistor thereof), which is an object to be monitored for overheating. With this configuration, it is possible to directly detect the junction temperature of the power transistor that generates heat, and thereby realize a high-accuracy overheat protection operation. The internal configuration and operation of the overheat protection circuit 1 will be described later in detail.

The switching power supply circuit 2 is a direct-current converter that converts the power supply voltage Vcc supplied via the external terminal T1 into a desired output voltage Vo and then feeds it to an unillustrated internal circuit. Incidentally, the switching power supply circuit 2 of this embodiment steps up the voltage in such a way that an output voltage Vo of 9 V is produced from the power supply voltage Vcc of 1.8 V.

Here, the power transistor that forms the switching power supply circuit 2 is a noise source of switching noise (pulse noise), which is generated by the on/off of the power transistor. As already mentioned, this makes it easier for the switching noise to superimpose on the power supply voltage Vcc of the overheat protection circuit 1 provided near the switching power supply circuit 2.

It is for this reason that the overheat protection circuit 1 of this embodiment includes filter means for removing from the power supply voltage Vcc a frequency component that is higher than a predetermined cut-off frequency, so as to perform a high-accuracy overheat protection operation despite variations in the power supply voltage (superimposition of pulse) due to the intrusion of the switching noise.

Hereinafter, with reference to FIG. 2, the circuit configuration and operation of the overheat protection circuit 1 will be specifically described in detail.

Figure 2:
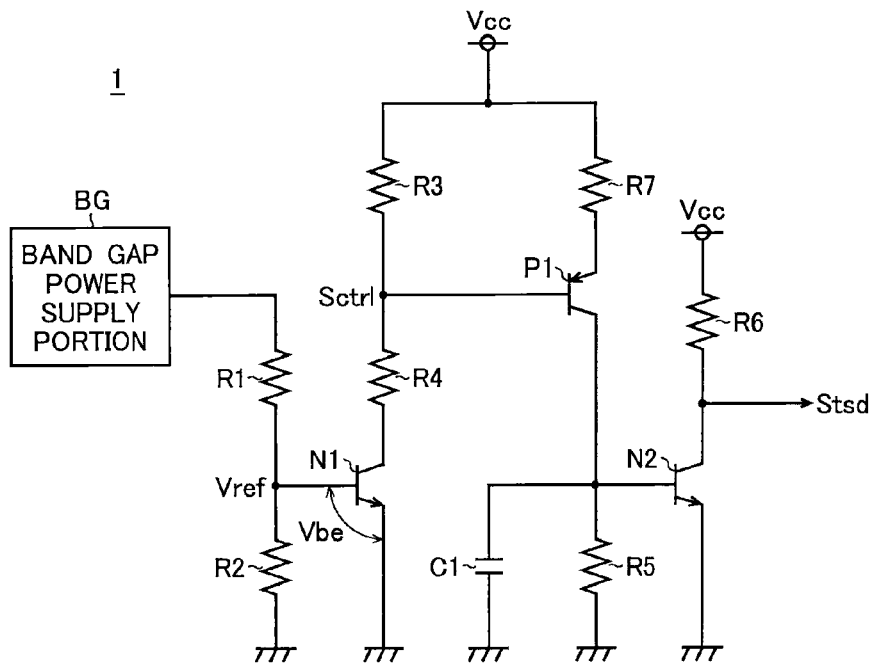
[FIG. 2] A circuit diagram showing an embodiment of an overheat protection circuit 1.

FIG. 2 is a circuit diagram showing an embodiment of the overheat protection circuit 1 (in particular, near a heat detecting portion thereof). As shown in this drawing, the overheat protection circuit 1 includes NPN bipolar transistors N1 and N2, a PNP bipolar transistor P1, a band gap power supply portion BG, resistors R1 to R7, and a capacitor C1.

The output node of the band gap power supply portion BG is grounded via the resistors R1 and R2. A node at which the resistors R1 and R2 are connected together is connected to the base of the transistor N1. The collector of the transistor N1 is connected via the resistors R4 and R3 to a point to which the power supply voltage Vcc is applied. The emitter of the transistor N1 is grounded. A node at which the resistors R3 and R4 are connected together is connected to the base of the transistor P1. The emitter of the transistor P1 is connected via the resistor R7 to a point to which the power supply voltage Vcc is applied. The collector of the transistor P1 is grounded via the resistor R5, and is grounded via the capacitor C1. The collector of the transistor P1 is connected to the base of the transistor N2. The collector of the transistor N2 is connected via the resistor R6 to a point to which the power supply voltage Vcc is applied. The collector of the transistor N2 also serves as an output node of the overheat protection circuit 1, and is connected to a control node of an unillustrated internal circuit and the switching power supply circuit 2.

That is, the overheat protection circuit 1 of this embodiment includes: reference voltage producing means (the band gap power supply portion BG that produces a band gap voltage which is independent of the ambient temperature, and a resistance dividing portion R1 and R2 that produces a reference voltage Vref from the band gap voltage) for producing a predetermined reference voltage Vref; a bipolar transistor N1 for temperature detection that is provided next to a power transistor (unillustrated) of the switching power supply circuit 2 and turned on/off according to whether the base-emitter forward voltage drop Vf which varies depending on the ambient temperature is higher or lower than the reference voltage Vref; control voltage signal generating means (the resistors R3 and R4) for generating from the power supply voltage Vcc the control voltage signal Sctrl having a logic according to the on/off state of the transistor N1; switch means (the transistor P1) that is turned on/off according to the logic of the control voltage signal Sctrl; and overheat protection signal generating means (the transistor N2 and resistors R5 and R6) for generating the overheat protection signal Stsd having a logic according to the on/off state of the transistor P1. In addition, the overheat protection circuit 1 includes, as filter means for removing a high frequency component from the power supply voltage Vcc, the resistor R7 inserted between the emitter of the transistor P1 and the point to which the power supply voltage Vcc is applied and the capacitor C1 inserted between the collector of the transistor P1 and the ground.

Next, the operation of the overheat protection circuit 1 configured as described above will be described in detail. Since the emitter of the transistor N1 for temperature detection is grounded, the base-emitter voltage Vbe thereof becomes equal to the reference voltage Vref (for example, 0.4 V) produced by dividing the band gap voltage (approximately 1.25 V) by the resistors, and has a flat temperature characteristic. On the other hand, the base-emitter forward voltage drop Vf of the transistor N1 has a negative temperature characteristic of approximately −2 mV/° C., which decreases as the ambient temperature increases.

As a result, during a period in which the reference voltage Vref is lower than the base-emitter forward voltage drop Vf of the transistor N1, that is, until the ambient temperature has reached a given threshold temperature (for example, 175° C.), the transistor N1 is kept off; when the reference voltage Vref exceeds the base-emitter forward voltage drop Vf of the transistor N1, that is, when the ambient temperature has reached a given threshold temperature, the transistor N1 is turned on. The threshold temperature described above can be appropriately adjusted according to the resistance ratio between the resistors R1 and R2.

When the transistor N1 is off, the control voltage signal Sctrl applied to the base of the transistor P1 takes a high level (becomes approximately equal to the power supply voltage Vcc), whereby the transistor P1 is kept off. At this point, the base of the transistor N2 takes a low level (becomes approximately equal to the ground potential), the transistor N2 is also kept off. As a result, the logic of the overheat protection signal Stsd at the collector of the transistor N2 takes a high level (becomes approximately equal to the power supply voltage Vcc). That is, by transmitting this high-level overheat protection signal Stsd, the overheat protection circuit 1 notifies the circuit to be protected that the chip temperature is normal. Upon receiving the overheat protection signal Stsd from the overheat protection circuit 1, the circuit to be protected finds that the logic thereof is at high level and that there is no abnormal rise in temperature. This allows it to perform normal operation.

On the other hand, when the transistor N1 is turned off, the control voltage signal Sctrl applied to the base of the transistor P1 has dropped to a low level (becomes approximately equal to the ground potential), whereby the transistor P1 is turned on. At this point, since the base of the transistor N2 has risen to a high level (becomes approximately equal to the power supply voltage Vcc), the transistor N2 is also turned on. As a result, the logic of the overheat protection signal Stsd takes a low level (becomes approximately equal to the ground potential). That is, by transmitting this low-level overheat protection signal Stsd, the overheat protection circuit 1 notifies the circuit to be protected that the chip temperature is abnormal. Upon receiving the overheat protection signal Stsd from the overheat protection circuit 1, the circuit to be protected finds that the logic thereof is at low level and that there is an abnormal rise in temperature. This allows it to stop operating.

The overheat protection circuit 1 of this embodiment includes, as filter means for removing a high frequency component (switching noise) from the power supply voltage Vcc, an RC filter circuit composed of the resistor R7 and the capacitor C1.

In the overheat protection circuit 1 of this embodiment, with consideration given to the fact that the frequency component of switching pulse superimposed on the power supply voltage Vcc is of the order of 100 MHz (in pulse-width terms, of the order of 10 ns), the resistor R7 of 10 kΩ and the capacitor C1 of 5 pF are used to set the cut-off frequency fc ($=1/(2\pi CR)$) of the RC filter circuit to 3.2 MHz. By adopting such a cut-off frequency, it is possible to reduce switching pulse to 3.2% ($=3.2/100\times100$).

Figure 3:
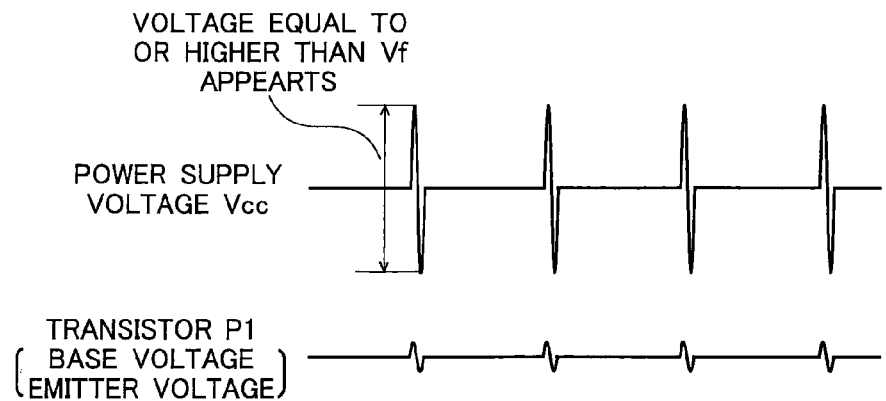
[FIG. 3] A diagram illustrating effectiveness in reducing switching noise.

Thus, in the overheat protection circuit 1 of this embodiment, even when noise (such as switching noise generated in the switching power supply circuit 2) higher than the base-emitter forward voltage drop Vf of the transistor P1 intrudes into the power supply voltage Vcc of the overheat protection circuit 1, this does not cause a significant change in amplitude of the emitter voltage, let alone the base voltage, of the transistor P1 (see FIG. 3). This filtering operation makes it possible to prevent a malfunction; for example, it helps prevent the logic of the overheat protection signal Stsd from being changed to a low level regardless of the generation of abnormal heat as a result of the transistor P1 being accidentally turned on momentarily by the switching noise. As a result, according to the invention, the overheat protection circuit 1 can be placed as near the power transistor, which is an object to be monitored for overheating, as possible. This makes it possible to directly detect the junction temperature of the power transistor, and thereby realize a high-accuracy overheat protection operation.

Incidentally, as means for adjusting the pair characteristic of a current mirror circuit, there is conventionally known a technology of inserting a resistor at the emitter of the transistor. However, the resistor R7 of this embodiment is filter means for removing noise superimposed on the power supply voltage Vcc, not means for adjusting the circuit characteristics.

Other than the embodiment specifically described above, as means for removing noise superimposed on the power supply voltage Vcc, a regulator can be provided along a path to which the power supply voltage is inputted, as long as a power supply voltage Vcc of 3 V or higher is fed to an overheat protection circuit, like the overheat protection circuit 1 of this embodiment, that can operate on a low input voltage from 1.25 V+1 Vsat (of the order of 0.1 V) and higher. Otherwise (for example, when the power supply voltage Vcc is of the order of 1.8 to 2.5 V), it is considered to be preferable (or necessary) to adopt the configuration of this embodiment since there is not enough voltage to provide the regulator.

The embodiment described above deals with a case in which the present invention is applied to a switching power supply IC. This, however, is not meant to limit the application of the invention in any way; the invention finds wide application in semiconductor integrated circuit devices of any other type such as motor driving devices.

It is to be understood that the present invention may be practiced in any other manner than specifically described above as embodiments, and various modifications are possible within the scope of the invention.

Figure 4:
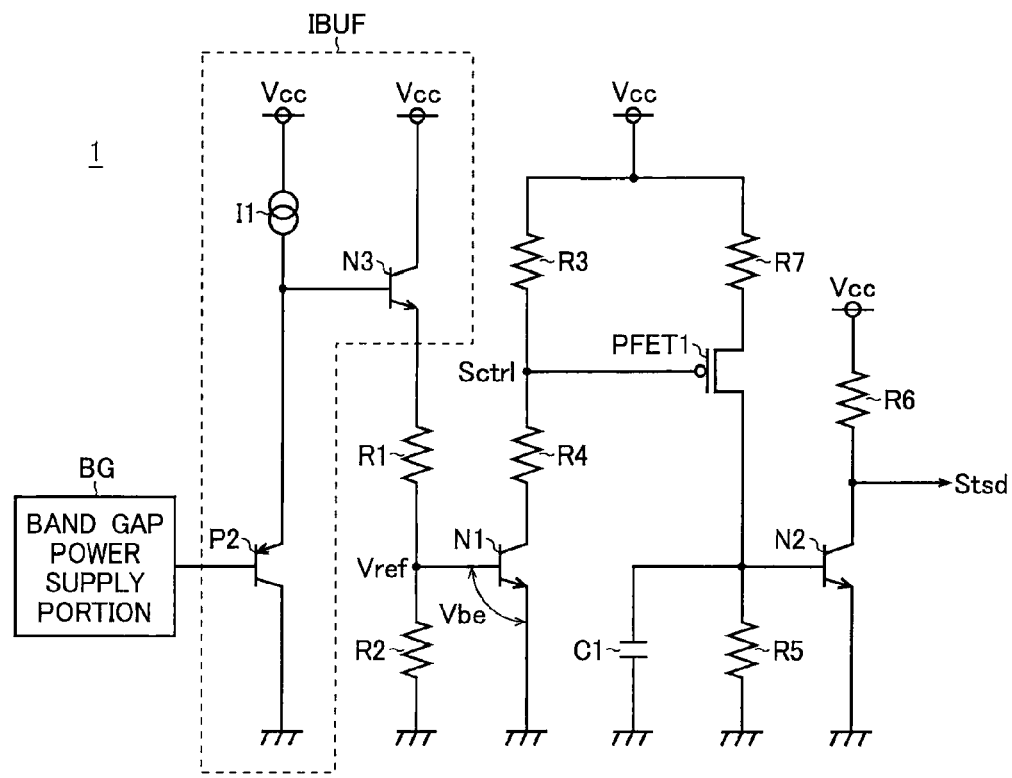
[FIG. 4] A circuit diagram showing another embodiment of the overheat protection circuit 1.

For example, as shown in FIG. 4, a P-channel field-effect transistor PFET1 may be used instead of the bipolar transistor P1.

As also shown in FIG. 4, in a case where the band gap power supply portion BG has a limited current outputting capability, a current buffer portion IBUF may be provided between the band gap power supply portion BG and the resistance dividing portion R1 and R2 for improving the current outputting capability by stepping up the band gap voltage by the transistor P2 by the voltage drop Vf and then stepping down the resultant voltage by the transistor N3 by the voltage drop Vf.

INDUSTRIAL APPLICABILITY

The present invention is useful in improving the accuracy of overheat protection of semiconductor integrated circuit devices. For example, the present invention can be suitably used in switching power supply devices and motor driving devices that incorporate a power transistor, which is a noise source, into an IC, and thereby easily suffer from the generation of heat as compared with semiconductor integrated circuit devices of any other type, and that require high reliability.

What is claimed is:

1. A semiconductor integrated circuit device comprising:
    a power transistor operable for switching control to be performed thereon; and an overheat protection circuit for detecting an abnormal rise in temperature of the power transistor and notifying a circuit to be protected of the abnormal rise in temperature, wherein the overheat protection circuit comprises:
- a filter portion for removing, from a power supply voltage thereof, a frequency component that is higher than a predetermined cut-off frequency,
- reference voltage producing circuitry to produce a predetermined reference voltage;
- a bipolar transistor for temperature detection that is provided next to the power transistor, wherein the bipolar transistor is operable to be turned on/off according to whether a base-emitter forward voltage drop which varies depending on an ambient temperature, is higher or lower than the reference voltage;
- control voltage signal generating circuitry for generating from the power supply voltage a control voltage signal having a logic according to an on/off state of the bipolar transistor;
- switch circuitry operable to be turned on/off according to the logic of the control voltage signal; and
- overheat protection signal generating circuitry to generate an overheat protection signal having a logic according to an on/off state of the switch circuitry, wherein, as the filter portion, the overheat protection circuit further comprises:
- a resistor disposed between one end of the switch circuitry and a point to which the power supply voltage is to be applied; and/or
- a capacitor disposed between another end of the switch circuitry and ground.

2. The semiconductor integrated circuit device of claim 1, wherein the reference voltage producing circuitry comprises:
- band gap power supply circuitry to produce a band gap voltage which is independent of the ambient temperature; and
- resistance dividing circuitry to produce the reference voltage from the band gap voltage.

3. The semiconductor integrated circuit device of claim 2, wherein the reference voltage producing circuitry comprises, between the band gap power supply circuitry and the resistance dividing circuitry, current buffer circuitry to improve current capability.

4. The semiconductor integrated circuit device according to any one of claims 1 to 3, wherein the power transistor forms part of a switching power supply circuit or a motor driving circuit.

5. A semiconductor integrated circuit device comprising:
- a power transistor for providing switching power supply and operable to be turned on/off by a high frequency switching noise source;
- an overheat protection circuit for detecting an abnormal rise in temperature and notifying a circuit to be protected of the abnormal rise in temperature, wherein the overheat protection circuit is sensitive to switching noise caused by turning the power transistor on/off; and
- a filter portion arranged to remove a frequency component that is higher than a predetermined cut-off frequency to prevent the overheat protection circuit from being influenced by the switching noise caused by turning the power transistor on/off.

6. The semiconductor integrated circuit device according to claim 5 wherein the power transistor and the overheat protection circuit are provided with common power, and wherein the overheat protection circuit is sensitive to the switching noise by way of the common power.

7. The semiconductor integrated circuit device according to claim 5 wherein the overheat protection circuit includes a temperature sensor and a detector provided with the common power to notify the abnormal rise in temperature in response to the temperature sensor, wherein the detector is provided with common power and is sensitive to the switching noise by way of the common power, and wherein the filter portion is arranged to remove the frequency component transmitted by way of the common power to prevent the overheat protection circuit from being influenced by the switching noise caused by turning the power transistor on/off.

* * * * *